United States Patent
Tsai et al.

(10) Patent No.: US 6,244,499 B1
(45) Date of Patent: Jun. 12, 2001

(54) STRUCTURE OF A BALL BUMP FOR WIRE BONDING AND THE FORMATION THEREOF

(75) Inventors: Yu-Fang Tsai; Jaw-Shiun Hsieh, both of Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 09/460,093

(22) Filed: Dec. 13, 1999

(51) Int. Cl.⁷ .................................................. B23K 31/02
(52) U.S. Cl. ............................................................ 228/180.5
(58) Field of Search ........................... 228/4.5, 1.1, 110.1, 228/180.5; 257/737, 738; 438/613

(56) References Cited

U.S. PATENT DOCUMENTS

| | | | |
|---|---|---|---|
| 4,415,115 | * 11/1983 | James | 228/170 |
| 5,172,851 | * 12/1992 | Matsushita et al. | 228/179 |
| 5,364,004 | * 11/1994 | Davidson | 228/1.1 |
| 5,485,949 | * 1/1996 | Tomura et al. | 228/180.5 |
| 5,559,054 | * 9/1996 | Adamjee | 437/183 |
| 5,858,149 | 1/1999 | Seo et al. | 156/150 |
| 5,871,141 | * 2/1999 | Hadar et al. | 228/180.5 |
| 6,017,812 | * 1/2000 | Yonezawa et al. | 438/613 |

FOREIGN PATENT DOCUMENTS

| | | |
|---|---|---|
| 409097794A | * 4/1997 | (JP) . |
| 409106988A | * 4/1997 | (JP) . |
| 410107036A | * 4/1998 | (JP) . |
| 410135222A | * 5/1998 | (JP) . |
| WO97/39480 | * 10/1997 | (WO) . |

\* cited by examiner

*Primary Examiner*—Tom Dunn
*Assistant Examiner*—Kiley Stoner
(74) *Attorney, Agent, or Firm*—Bacon & Thomas

(57) ABSTRACT

The ball bump mainly includes a body and a protrusion. The protrusion is located at the upper of the body and essentially consists of a flat upper surface with an annular inclination. The flat upper surface and the annular inclination together define the area for wire bonding. The method of the formation of the ball bump of wire bonding mainly comprises steps of: an end of a wire held by a bonding machine is melted to form a ball; the bonding machine bonds the ball onto the bonding pad to form a ball bump; the bonding tool moves upward a predetermined vertical distance and the clamp of the bonding tool is then opened; the bonding tool is moved a predetermined horizontal distance to reduce the connection part of wire connecting to the upper of the ball bump for the convenience of wire cutting, and this forms a protrusion on the ball bump consisting of a flat upper surface with an annular inclination; the bonding tool is again moved upward a predetermined vertical distance, and the clamp releases the wire for the ball bump process which follows; the clamp is closed to hold the wire and is moved upward to pull the wire, and the wire is cut along the heat affected zone and leaves a smaller tip on the ball bump.

2 Claims, 4 Drawing Sheets

STRUCTURE OF A BALL BUMP FOR WIRE BONDING AND THE FORMATION THEREOF

BACKGROUND OF THE INVENTION

1. Field of the Invention

The present invention is related to the structure of a ball bump of wire bonding and the formation thereof and more particularly to the formation of the ball bump with a bonding portion that provides a flat upper surface for wire bonding.

2. Description of the Related Art

To avoid the destruction of the bonding pads during wire bonding onto the bonding pad of the semiconductor device, the ball bump is arranged on the bonding pad in such a way as to protect it. Although the ball bump protects the bonding pad directly from being struck, wire bonding on an irregular upper surface of the ball bump increases the variability of results. Providing that a bonding machine uses the same set of wire bonding parameters, an irregular upper surface reduces the quality and reliability of wire bonding of the semiconductor device.

The prior art of the U.S. Pat. No. 5,858,149, issued on Jan. 12, 1999 to Seo et al., discloses the structure of a ball bump and the formation thereof As shown in FIG. 1, the chip 100 has a bonding pad 101. A bonding tool 110, located above the chip 100, holds a wire 120 which is melted to form a ball 121. As shown in FIG. 2, the bonding tool 110 strike the ball onto the bonding pad 101 of the chip 100 such that the bottom of the ball adheres to the bonding pad 101. Then, the clamp 111 of the bonding tool 110 is opened and the bonding tool 110 presses the ball bump 130. As shown in FIG. 3, the bonding tool 110 is moved upward a predetermined distance so as to reserve an appropriate distance of wire 120. The clamp 111 is then closed to hold the wire 120, and the bonding tool 110 is moved upward to pull the wire 120. The ball bump 130 and the wire 120 are cut along the heat-affected zone and leave the ball bump 130 on the bonding pad 101. However, the upper of the ball bump 130 forms a tip 131 whose height is determined by the heat affected-zone of the wire 120; so tip 131 varies in accordance with the heat-affected zone and increases the variability of wire bonding. When the bonding tool 110 directly pushes the tip 131 in a horizontal direction, this results in the collapse and shift of tip 131, and the irregular upper surface of the tip 131 increases the variability of the ball bump 130.

The present invention intends to provide a structure for the ball bump which includes a bonding portion on which a flat upper surface of uniform height is formed so as to reduce the variability of wire bonding in such a way as to mitigate and overcome the above problem.

SUMMARY OF THE INVENTION

The primary objective of this invention is to provide a structure of the ball bump for wire bonding and the formation thereof, to form a flat upper surface on the bonding portion of the ball bump for wire bonding. By eliminating the irregularities in the structure of the ball bump, the quality and reliability of wire bonding is increased.

The secondary objective of this invention is to provide a structure for the ball bump of wire bonding and the formation thereof, such that the tip of the ball bump on the flat upper surface of the bonding portion is smaller and more uniform in structure thus the regular structure of the ball bump increase the quality and the reliability of the wire bonding.

The present invention defines the structure of the ball bump of wire bonding. The ball bump mainly includes a body and a protrusion. The protrusion is located at the upper of the body and essentially consists of a flat upper surface with an annular inclination. The flat upper surface and the annular inclination together define the wire bonding area.

The present invention is a method for the formation of the ball bump for wire bonding. The formation of the ball bump for wire bonding mainly comprises steps of: the end of a wire held by a bonding machine is melted to form a ball; the bonding machine bonds the ball onto the bonding pad to form a ball bump; the bonding tool is moved upward a predetermined vertical distance and the clamp of the bonding tool is then opened; the bonding tool moves a predetermined horizontal distance to decrease the connection part of wire connecting to the top of the ball bump for the convenience of wire cutting, this creates a protrusion from the ball bump consisting of a flat upper surface with an annular inclination; the bonding tool is again moved upward a predetermined vertical distance, and the clamp is opened to release the wire for the ball bump process which follows; the clamp is then closed to hold the wire and moved upward to pull the wire; the wire is cut in the heat-affected zone therefore leaving a smaller tip on the ball bump.

Other objectives, advantages and novel features of the invention will become more apparent from the following detailed description and the accompanying drawings.

BRIEF DESCRIPTION OF THE DRAWINGS

The present invention will now be described in detail with reference to the accompanying drawings herein.

DETAILED DESCRIPTION OF THE INVENTION

The formation of the ball bump of wire bonding mainly comprises steps of: the end of a wire held by a bonding machine is melted to form a ball; the bonding machine bonds the ball onto the bonding pad to form a ball bump; the bonding tool is moved a predetermined vertical distance and the clamp of the bonding tool is opened; the bonding tool is then moved a predetermined horizontal distance to reduce the connection part of the wire connecting to the upper of the ball bump for the convenience of wire cutting, thus forming a protrusion of the ball bump which consists of a flat upper surface with an annular inclination; the bonding tool is again moved a predetermined vertical distance, the clamp releases the wire for the ball bump process which follows; the clamp is closed to hold the wire and moves upward to pull the wire, so the wire is cut along the heat affected zone of the connection part and therefore the wire leaves a smaller tip on the ball bump.

Figure 4:
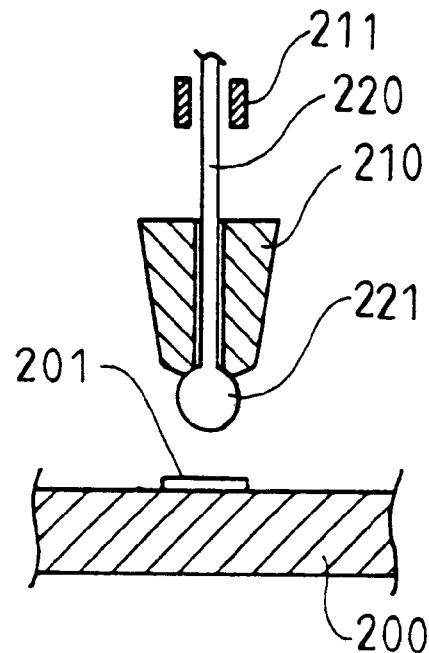
FIG. 4 is a side view of the first step of ball bump formation in accordance with the embodiment of the present invention.
Figure 5:
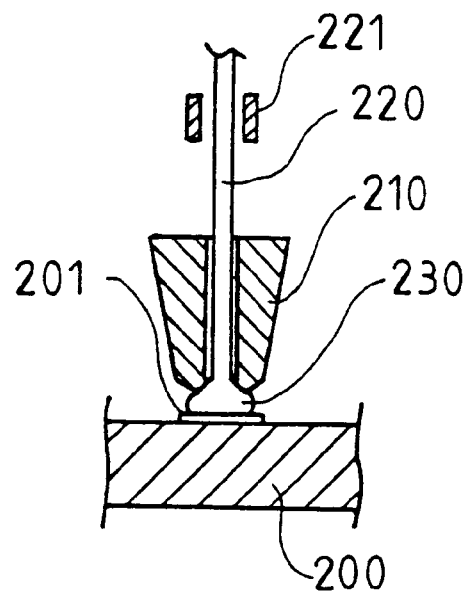
FIG. 5 is a side view of the second step of ball bump formation in accordance with the embodiment of the present invention.

Referring to FIG. 4, a capillary 210 of the bonding tool holds the wire 220 at an appropriate length and the end of the wire 220 is melted to form a ball 221 for ball bump bonding. Then the clamp 211 is opened.

Referring to FIGS. 4, 5, 6 and 7, the capillary 210 of the bonding tool moves downward onto a bonding pad 201 of the chip 200 to form a ball bump 230. Because the capillary 210 has an annular inclination, the ball 221 is mechanically pressed to form the ball bump 230, and the wire 220 remains connected to the ball bump 230.

Figure 6:
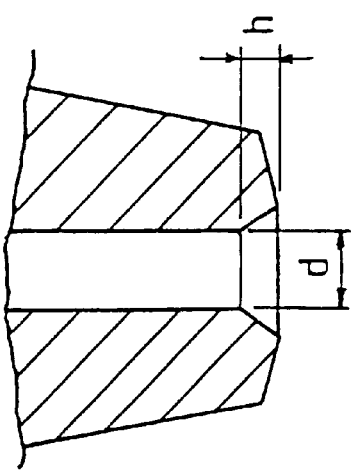
FIG. 6 is an enlarged view of the bonding tool of FIG. 5 in accordance with the embodiment of the present invention.

Referring to FIG. 6, the method of formation of the ball bump 230, in accordance with the embodiment of the present invention, applies a capillary 210 which has a feed hole with a diameter "d" for receiving the wire 220, a flat bottom face, and a chamfer with a height "h" surrounding the feed hole at the flat bottom face. Typically, the height "h" is 0.3–1.0 mil and the diameter "d" is 1.3–1.5 mil.

Figure 8:
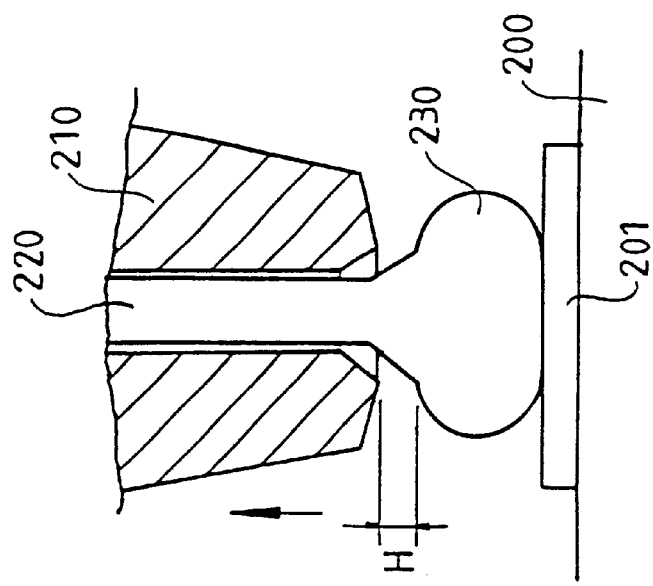
FIG. 8 is a side view of the third step of ball bump formation in accordance with the embodiment of the present invention.
Figure 7:
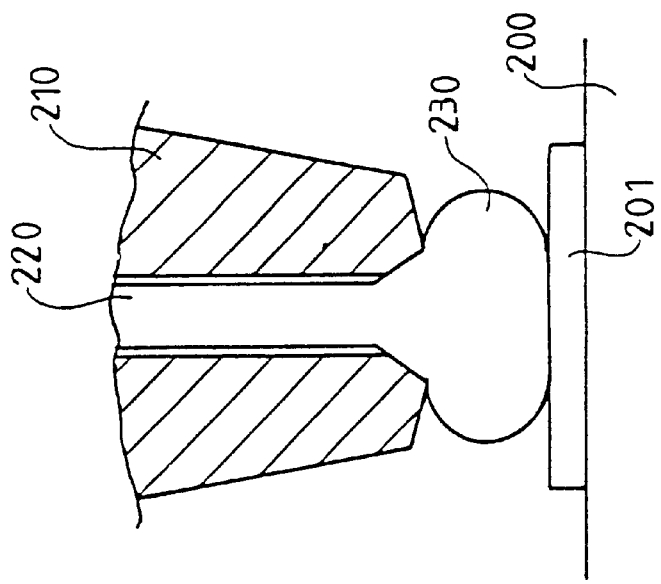
FIG. 7 is an enlarged view of the bonding tool of FIG. 5 in accordance with the embodiment of the present invention.

Referring to FIGS. 6 and 8, the capillary 210 rises vertically a height "H" with the clamp 211 open and then stops. Preferably, the height "H" is the height "h" of the chamfer of the capillary 210.

Figure 9:
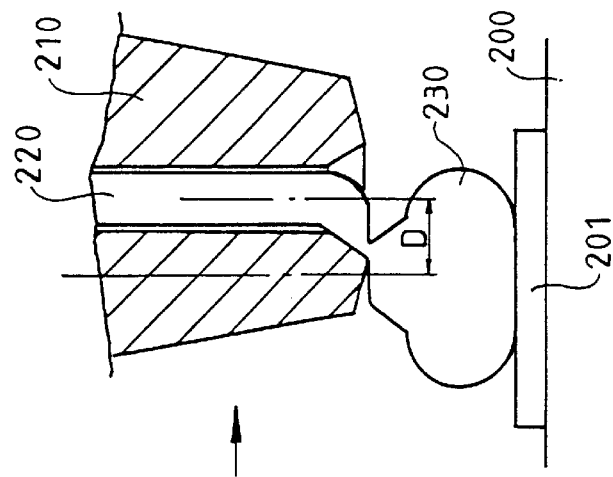
FIG. 9 is a side view of the fourth step of ball bump formation in accordance with the embodiment of the present invention.

Referring to FIGS. 6 and 9, after the capillary 210 moved vertically a height "H" and stopped, the capillary 210 is moved a distance "D", called smooth distance, in a horizontal direction thus formation a protrusion with a flat upper surface for wire bonding. The wire 220 is pushed to the side by the capillary 210 to reduce the connection part of the wire 220 for the convenience of wire cutting. The distance "D", as well as the width of the protrusion, is preferably $\frac{2}{3}$–$\frac{7}{8}$ of the diameter of the wire 220 and can be adjusted according to the gap between the wire 220 and the opening of the capillary 210.

Figure 11:
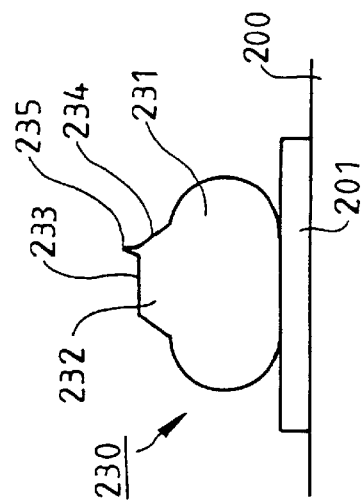
FIG. 11 is a side view of the sixth step of ball bump formation in accordance with the embodiment of the present invention.
Figure 10:
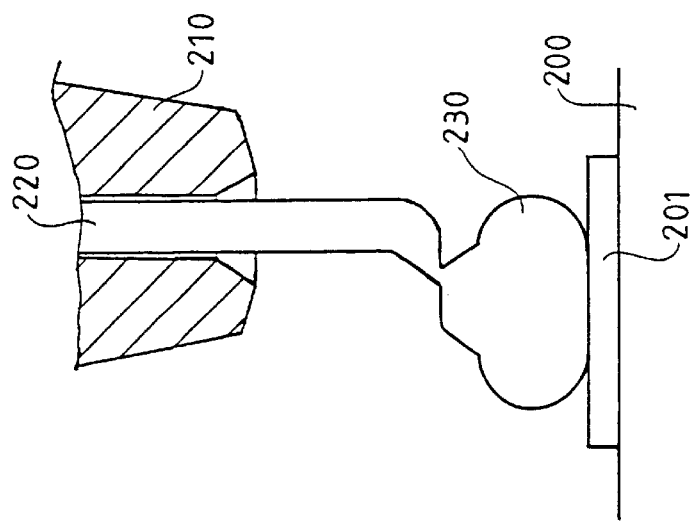
FIG. 10 is a side view of the fifth step of ball bump formation in accordance with the embodiment of the present invention.

Referring to FIGS. 10 and 11, the capillary 210 is again moved vertically upward a predetermined distance from the ball bump 230. The clamp releases the wire 220 for the ball bump process which follow. When the wire 220 is cut off from the ball bump 230, a length of the wire 220 is reserved on the capillary 210 and is melted to form a ball. The capillary 210 is moved upward in a vertical direction from ball bump 230. The wire 220 is cut off along the heat-affected zone so as to provide a smaller tip on the flat upper surface 233.

Referring to FIG. 11, the ball bump 230 of the present invention mainly includes a body 231 and a protrusion 232. The protrusion 232 is located at the upper of the body 231 and essentially consists of a flat upper surface 233 with an annular inclination 234. The flat upper surface 233 and the annular inclination 234 form the upper surface and side surface of the protrusion 232, respectively. The smooth surface and the uniform level of the protrusion 232 together provide a regular structure for wire bonding, and a tip 235 is left between the flat upper surface 233 and the annular inclination 234. Even though the smaller tip 235 is left on the protrusion 232, the variability of wire bonding on the protrusion 232 is less than usual.

Figure 1:
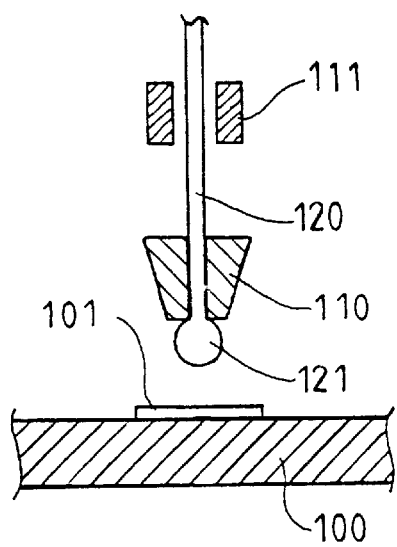
FIG. 1 is a side view of the first step of ball bump formation in accordance with the prior art.
Figure 2:
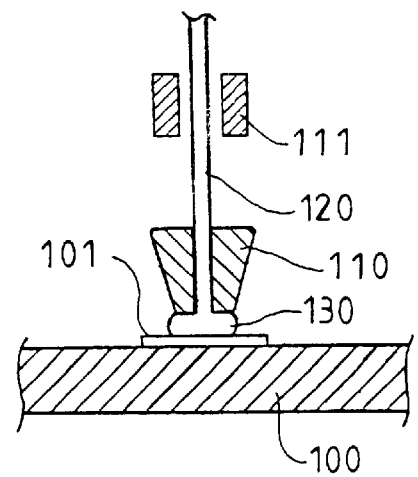
FIG. 2 is a side view of the second step of ball bump formation in accordance with the prior art.
Figure 3:
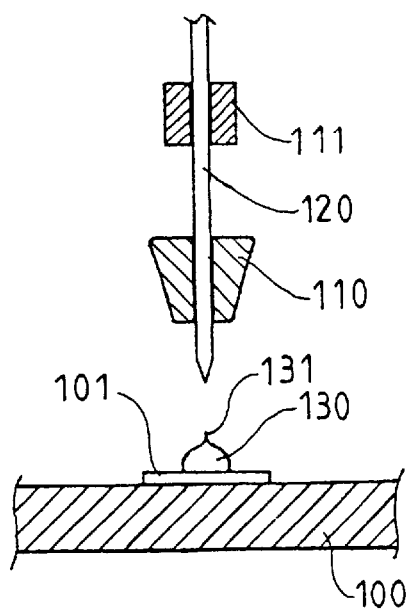
FIG. 3 is a side view of the third step of ball bump formation in accordance with the prior art.

Comparing FIG. 3 with FIG. 11, the ball bump 130 of the prior art with the tip 131 reduces the bondability and reliability of the wire bonding; but the ball bump 230 of the present invention with its flat upper surface 233 and the annular inclination increases the bondability and reliability of wire bonding. Therefore, the wire bonding of the present invention increases the bondability and reliability by using a set of parameters.

The body and protrusion of the ball bump of the present invention have a uniform total height, under proper controls. Thus the present invention provides a uniform height of balls on a substrate. Therefore, the present invention can be applied to flip chip bonding in such a way that the protrusions of the ball bump are aimed and attached to the corresponding bonding pad of the chip and then reflow to electrically connect to the corresponding bonding pad.

Although the invention has been described in detail with reference to its presently preferred embodiment, it will be understood by one of ordinary skill in the art that various modifications can be made without departing from the spirit and the scope of the invention, as set forth in the appended claims.

What is claimed is:

1. A method of forming a ball bump on a bonding pad of a chip for wire bonding, the method consisting of the following steps in the sequence set forth:

providing a bonding tool having a capillary holding a wire with a ball formed on the end of the wire wherein the capillary has a feed hole for receiving the wire, a flat bottom face, and a chamfer with a height (h) surrounding the feed hole at the flat bottom face;

moving the capillary downward to bring the ball in contact with the bonding pad of the chip and pressing the ball to form a ball bump on the end of the wire;

moving the capillary upward vertically for a first distance substantially equal to the height (h) without breaking the wire;

moving the capillary horizontally for a second distance substantially equal to $\frac{2}{3}$–$\frac{7}{8}$ of the diameter of the wire without breaking the wire;

moving the capillary upward for a predetermined distance such that a length of the wire is reserved for forming another ball; and clamping the wire in the bonding tool and raising the capillary to break the wire from the ball bump.

2. The method of claim 1 wherein the height (h) is from 0.3 to 1.0 mil.

\* \* \* \* \*